(12) United States Patent
Arakawa

(10) Patent No.: US 6,564,989 B2
(45) Date of Patent: May 20, 2003

(54) WIRE BONDING METHOD AND WIRE BONDING APPARATUS

(75) Inventor: Hideyuki Arakawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 116 days.

(21) Appl. No.: 09/768,350

(22) Filed: Jan. 25, 2001

(65) Prior Publication Data

US 2002/0027151 A1 Mar. 7, 2002

(30) Foreign Application Priority Data

Aug. 22, 2000 (JP) ............................. 2000-250887

(51) Int. Cl.$^7$ ............................ B23K 31/02; B23K 37/00
(52) U.S. Cl. ........................ 228/180.5; 228/4.5
(58) Field of Search ........................... 228/180.5, 4.5, 228/110.1, 1.1

(56) References Cited

U.S. PATENT DOCUMENTS 4,272,007 A * 6/1981 Steranko ................. 228/213
4,805,830 A * 2/1989 Kawaguchi ............... 219/85.19
4,928,871 A * 5/1990 Farassat ................... 228/180.5
5,653,380 A * 8/1997 Haji ........................ 228/180.5
5,676,856 A * 10/1997 Haji et al. ................ 219/56.21
5,685,476 A * 11/1997 Miyoshi ................... 228/180.5
5,957,371 A * 9/1999 Miyano et al. .......... 219/56.21
5,992,725 A * 11/1999 Egawa et al. ............. 228/111.5

FOREIGN PATENT DOCUMENTS

| JP | 401102934 A | * 4/1989 |
| JP | 4-206841 | 7/1992 |
| JP | 7-147296 | 6/1995 |
| JP | 10-256299 | 9/1998 |
| JP | 2002064117 A | * 9/1999 |

* cited by examiner

*Primary Examiner*—Tom Dunn
*Assistant Examiner*—Kiley Stoner
(74) *Attorney, Agent, or Firm*—Leydig, Voit & Mayer, Ltd.

(57) ABSTRACT

A wire bonding apparatus includes a bonding tool having a pressing surface for pressing a wire onto a surface to be joined to the wire and a wire feeding hole open to the pressing surface; a wire feeder for feeding the wire outside of the bonding tool through the wire feeding hole; and a magnet for applying an attraction force to a wire tip end protruding from the wire feeding hole, to bend and hold the wire tip end towards the pressing surface.

13 Claims, 9 Drawing Sheets

WIRE BONDING METHOD AND WIRE BONDING APPARATUS

BACKGROUND OF THE INVENTION

1. Field of the Invention

The present invention relates to a wire bonding method known as a method for establishing an electrical connection in producing a semiconductor device, and a wire bonding apparatus used therefor. Further, it relates to a semiconductor device produced using the method and apparatus.

2. Description of the Background Art

Hitherto, in producing a semiconductor device having a semiconductor chip, the wire bonding method has been used for establishing electrical connection between a connection electrode of the semiconductor chip and an external leading electrode on the side on which the semiconductor chip is to be mounted. The material of the wire used for bonding generally contains aluminum or gold as a major component; however, those containing copper as a major component may be used in some cases. Hereafter, in the wire bonding method, the operation of connecting one end of the wire to the first site among the two sites to be connected with the wire is referred to as "first bonding", and the operation of connecting the other end of the wire to the second site is referred to as "second bonding".

Roughly classified, the wire bonding methods can be divided into the ball bonding method and the wedge bonding method.

With reference to FIGS. 10A, 10B, 11, and 12, the ball bonding method will be described. Referring to FIGS. 10A and 10B, a step of forming a ball is performed before the first bonding. Namely, referring to FIG. 10A, a wire 2 is allowed to protrude from a tip end of a bonding tool 1, and a torch electrode 35 is allowed to approach a wire tip end part 3 to generate an arc discharge. This allows the wire tip end part 3 to be instantaneously melted locally with a high temperature caused by the arc discharge, whereby a ball 31 such as shown in FIG. 10B is formed and resolidified in an extremely short period of time. After this ball 31 is pressed onto a site to be joined, a pressure is applied with the bonding tool 1, and a supersonic wave is applied for vibration. Even if an oxide coating film or the like is present on a surface of the ball 31 or on a surface of the site to be joined, the oxide coating film is destroyed by friction accompanying the supersonic wave vibration, whereby the metals are brought into direct contact with each other to generate diffusion for joining. A heat may be applied besides the supersonic wave. For example, the metals are subjected to the supersonic wave vibration while being heated at about 300° C. Here, the ball bonding method is generally utilized only for the first bonding, and the second bonding is usually carried out in the same manner as the later mentioned wedge bonding method.

In the ball bonding method, a wire 2 material once melted immediately after the arc discharge resolidifies as the ball 31, whereby a recrystallized region 34 appears at a neck part of the ball 31, as shown in FIG. 11. Such a recrystallized region 34 has a property of being hard and brittle, so that this part cannot be bent to a great extent. Therefore, the configuration of the wire bonding must be designed in such a manner that the wire 2 starts to bend mainly at a part above the recrystallized region 34, as shown in FIG. 12. For this reason, the ball bonding method cannot meet the demand of a so-called "lower loop" for restraining the loop height H, which is the maximum height of the wire 2 from the joining surface 15.

As a countermeasure for solving this problem, an attempt is made to reduce the recrystallized region 34 by adjusting the amount of impurities mixed into the material of the wire 2; however, another new problem occurs by adjusting the amount of the impurities. Namely, a so-called "sink mark" is generated in which holes appear in the inside of the ball 31, or the joining property is deteriorated, or a brittle alloy layer is liable to be generated.

Further, by the ball bonding method, the ball 31 is deformed to a ball collapse diameter of 60 to 100 μm, which corresponds to about three to four times of the diameter (20 to 30 μm) of the wire 2, for joining. This requires a large area for joining. Furthermore, the diameter of the ball 31 formed as a result of the arc discharge is varied, and it is difficult to precisely control the diameter. For this reason, the configuration must be designed on the basis of the maximum attainable diameter, thereby requiring a further large area. Therefore, the ball bonding method is extremely disadvantageous in satisfying the demand of a so-called "finer pitch" for reducing the pitch of the wire bonding and carrying out the wire bonding at a high density.

A method that compensates for this disadvantage is the wedge bonding method. Referring to FIGS. 13 to 18, the wedge bonding method will be described. In this method, first, a part of the wire 2 is allowed to protrude from the bonding tool 1, as shown in FIG. 13. The process up to this step is the same as that of the aforesaid ball bonding method. A wire bending rod 6 is displaceably placed in the vicinity of this protruding wire tip end part 3. As shown in FIG. 14, the wire bending rod 6 moves to hit the wire tip end part 3 thereby to bend the wire tip end part 3. As a result of this, the wire tip end part 3 is bent along the shape of a pressing surface 14 of the bonding tool 1.

As shown in FIG. 15, the bonding tool descends together with the wire 2, and the bent wire tip end part 3 is pressed onto an external leading electrode 7 which is an object of the first bonding. Here, in the same manner as in the ball bonding method, a supersonic wave is applied while applying pressure with the pressing surface 14. Heat may be applied besides the supersonic wave. For example, supersonic wave vibration is applied while heating at about 300° C. As a result of this, the wire tip end part 3 is crushed into a flat shape, as shown in FIG. 15, and is joined to the external leading electrode 7.

Next, as shown in FIG. 16, the bonding tool 1 is moved to a position of the second bond, and is pressed onto a connection electrode 53 of a semiconductor chip 8. The wire 2 follows the movement of the bonding tool 1 from the first bond even if it is not bent by the wire bending rod 6, so that a part of the wire 2 is always sandwiched by the pressing surface 14 and pressed. Here, in the same manner as in the first bonding, a supersonic wave is applied to the sandwiched wire 2 while the wire 2 is pressed by the pressing surface 14. Alternatively, heat is applied besides the supersonic wave. Thus, the wire 2 is joined to the connection electrode 53.

While a wire cutting clamp 9 is in a released state, the bonding tool rises by a length of L, as shown in FIG. 17, and the wire cutting clamp 9 is closed. While the wire 2 is held by the wire cutting clamp 9, the bonding tool 1 rises. Then, the wire 2 is fractured at an end of the region where the wire is pressed into a flat shape by the second bond. As a result of this, the bonding tool 1 rises in a state in which the wire 2 is protruding by the length of L from its tip end, as shown in FIG. 18. Then, the process proceeds to the next operation for the first bonding.

The wire tip end part 3 crushed by the wedge bonding method occupies an elongate shape having its width increased to about twice the diameter; however, the width is small as compared with the area occupied by the ball 31 in the ball bonding method, thereby providing an advantage for the finer pitch. Further, since it is not resolidified after being once melted, the recrystallized region 34 (See FIG. 11) does not appear, thereby providing an advantage for the lower loop.

However, in the wedge bonding method, the bending direction of the wire tip end part 3 is determined by the direction in which the wire bending rod 6 can move, so that the lying direction of the wire pressed onto the joining surface is determined. Therefore, the direction in which the wire bonding can be carried out is limited and, if one wishes to perform wire bonding in a different direction, the wire bonding apparatus or the work piece must be rotated, thereby leading to low productivity.

Therefore, an object of the present invention is to provide a wire bonding method and a wire bonding apparatus being advantageous to the lower loop and the finer pitch and having a high productivity.

SUMMARY OF THE INVENTION

In order to achieve the aforesaid object, a wire bonding apparatus according to one aspect of the present invention includes a bonding tool having a pressing surface for pressing a wire onto a surface to be joined and a wire feeding hole being open to the pressing surface; a wire feeding means for feeding the wire to an outside of the bonding tool through the wire feeding hole; and an attracting and holding means for applying an attraction force to a wire tip end part that is protruded from the wire feeding hole, thereby to bend and hold the wire tip end part towards the pressing surface.

By adopting the aforesaid construction, the wire tip end part can be bent and held by the attraction force applied by the attracting and holding means without the use of an external member such as a rod. The wire can be joined by pressing the wire together with the bonding tool onto the surface to be joined and treating it in the same manner as in the wedge bonding method.

The aforesaid invention preferably includes an attraction force distribution changing means for changing a distribution of the attraction force of the attracting and holding means thereby to bend the wire tip end a part in a desired direction. By adopting this construction, the wire tip end part can be bent and held in a direction in which the wire is desired to be joined. Therefore, it can be applied to wire bonding in a semiconductor device in which the joining direction of the wire changes depending on the electrode.

In the aforesaid invention, the attracting and holding means preferably includes a magnet disposed to apply a magnetic attraction force from the pressing surface to the wire tip end part. By adopting this construction, the wire tip end part containing a magnetic substance to be capable of being attracted by magnetic force can be attracted towards the pressing surface by magnetic force.

In the aforesaid invention, the magnet is preferably an electromagnet. By adopting this construction, the presence or absence of the magnetic line of force can be switched by whether the electric current is passed or not, whereby an operation of generating or releasing the attraction force can be carried out easily.

Further, a wire bonding apparatus according to another aspect of the present invention includes a bonding tool having a pressing surface for pressing a wire onto a surface to be joined and a wire feeding hole being open to the pressing surface; a wire feeding means for feeding the wire to an outside of the bonding tool through the wire feeding hole; a plurality of attracting and holding means for applying an attraction force to a wire tip end part that is protruded from the wire feeding hole, thereby to bend and hold the wire tip end part towards the pressing surface; and an attracting and holding means selecting means that can bend the wire tip end part in a desired direction depending on which of the plurality of attracting and holding means is operated.

By adopting the aforesaid construction, the wire tip end part can be bent and held by the attraction force applied by the plurality of attracting and holding means without the use of an external member such as a rod. The wire can be joined by pressing the wire together with the bonding tool onto the surface to be joined and treating it in the same manner as in the wedge bonding method.

In the aforesaid invention, the attracting and holding means preferably include a plurality of suction holes disposed to surround the wire feeding hole and each being capable of generating a negative pressure. By adopting this construction, the wire tip end part can be attracted by the negative pressure to be bent and held even if the wire is made of a material that cannot be attracted by magnetic force.

In the aforesaid invention, the suction holes are preferably disposed in the pressing surface. By adopting this construction, the wire tip end part can be attracted towards the pressing surface and can be held in a state in which the wire tip end part is adhering to the pressing surface, whereby the wire tip end part can be pressed by the pressing surface with certainty.

Further, in order to achieve the aforesaid object, a wire bonding method according to the present invention is a wire bonding method using a bonding tool having a pressing surface for pressing a wire onto a surface to be joined and a wire feeding hole being open to the pressing surface, wherein the method includes a wire feeding step for feeding the wire from the wire feeding hole; an attracting and holding step for applying an attraction force to a wire tip end part that is protruded from the wire feeding hole, thereby to bend and hold the wire tip end part towards the pressing surface; and a joining step for pressing and joining the wire tip end part onto a surface to be joined by the pressing surface.

By adopting this method, the wire tip end part can be bent and held by the attraction force applied in the attracting and holding step without the use of an external member such as a rod. The wire can be joined in the joining step in the same manner as in the wedge bonding method.

In the aforesaid invention, the wire tip end part is preferably bent in a desired direction by changing a distribution of the attraction force in the attracting and holding step. By adopting this method, the wire tip end part can be bent towards the side where the attraction force is strong, and can be held on the pressing surface.

In the aforesaid invention, the wire tip end part is preferably bent in a desired direction by switching which of a plurality of attracting and holding means is operated in the attracting and holding step. By adopting this method, the selection of the direction in which the wire tip end part is to be bent can be carried out by selecting the means to be operated from among the plurality of attracting and holding means, so that the selection can be carried out easily and with certainty.

In the aforesaid invention, the attracting and holding step preferably includes applying a magnetic attraction force to the wire tip end part. By adopting this method, the wire tip end part containing a magnetic substance to be capable of being attracted by magnetic force can be attracted towards the pressing surface by magnetic force.

In the aforesaid invention, the magnetic attraction force is preferably generated by an electromagnet. By adopting this method, the presence or absence of the magnetic line of force can be switched by whether the electric current is passed or not, whereby an operation of generating or releasing the attraction force can be carried out easily.

In the aforesaid invention, the attracting and holding step preferably includes applying a negative pressure to the wire tip end part. By adopting this method, the wire tip end part can be attracted by the negative pressure to be bent and held even if the wire is made of a material that cannot be attracted by magnetic force.

Further, a semiconductor device according to the present invention includes a wiring line subjected to wire bonding by making use of a bonding tool having a pressing surface for pressing a wire onto a surface to be joined and a wire feeding hole being open to the pressing surface, feeding the wire through the wire feeding hole, applying an attraction force to a wire tip end part that is protruded from the wire feeding hole, thereby to bend and hold the wire tip end part towards the pressing surface, and pressing and joining the wire tip end part to the surface to be joined by the pressing surface.

By adopting this construction, the wire can be joined in a desired direction, so that the wire can be disposed by effectively utilizing the space, eliminating the need for a large area such as a ball in the joining site. This is advantageous for the finer pitch. Further, since the balls are not formed, the recrystallized region is not generated, so that a small and thin semiconductor device can be produced which is advantageous for the lower loop.

These and other objects, features, aspects, and advantages of the present invention will become more apparent from the following detailed description of the present invention when taken in conjunction with the accompanying drawings.

DESCRIPTION OF THE PREFERRED EMBODIMENTS (First Embodiment)

Figure 1:
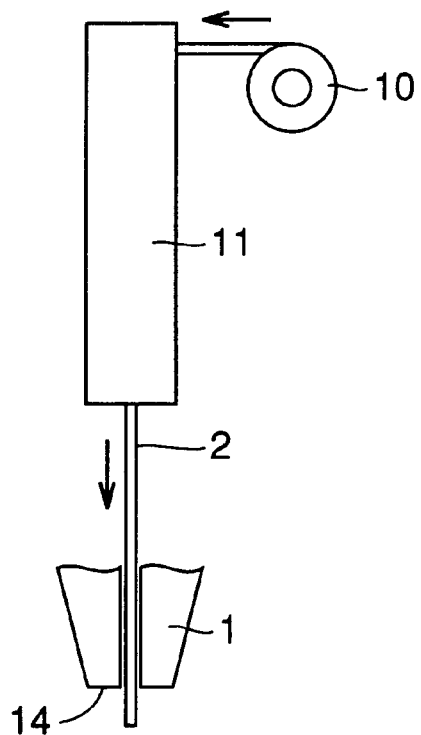
FIG. 1 is a schematic view illustrating a wire bonding apparatus according to the first embodiment of the present invention.
Figure 2:
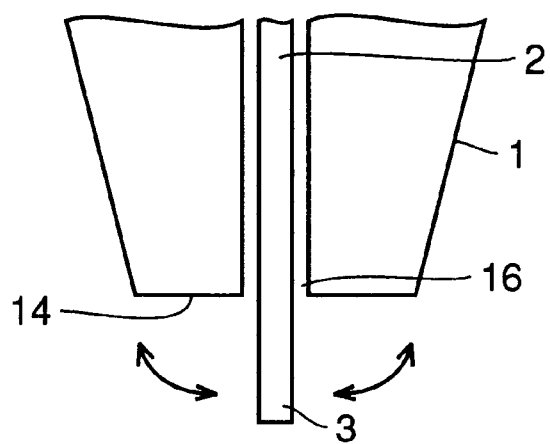
FIG. 2 is a schematic enlarged view of an essential part of the wire bonding apparatus according to the first embodiment of the present invention.

FIG. 1 shows a construction of a wire bonding apparatus according to the first embodiment of the present invention. The wire bonding apparatus includes, in its upper part, a wire spool 10 that stores a wire 2 for bonding as a wire feeding means, and a wire driving device 11 that stably feeds the wire 2 from the wire spool 10 to a bonding tool 1 so that the wire 2 may not become loose or caught. The bonding tool 1 is disposed at a lower part of the apparatus. FIG. 2 shows an enlarged view of the vicinity of the bonding tool 1. The bonding tool 1 includes a pressing surface 14 for pressing the wire 2 onto a surface to be joined, and a wire feeding hole 16 being open to the pressing surface 14. Further, the bonding tool 1 includes an electromagnet 4 such as shown in FIGS. 3A and 3B as an attracting and holding means for applying an attraction force to a wire tip end part 3 to bend and hold the wire tip end part 3 towards the pressing surface 14 when the wire tip end part 3 is protruding from the wire feeding hole 16.

Figure 3A:
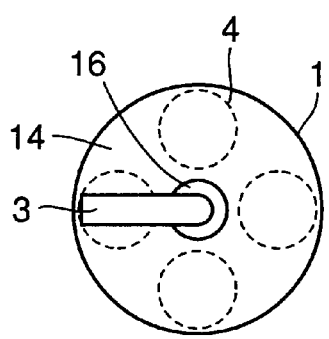
FIG. 3A is a schematic view illustrating an essential part of a bonding tool of the wire bonding apparatus according to the first embodiment of the present invention, as seen from its bottom side.

As shown in FIG. 3A, four electromagnets 4 are disposed to surround the wire feeding hole 16. As shown in FIG. 3B, each of the electromagnets 4 is connected to a power source 12 by a wiring line, and the wire bonding apparatus includes a switch 13 as an attracting and holding means selecting means for selecting which of the four electromagnets 4 is to be operated.

However, the wire 2 is usually made of a material such as aluminum, gold, or copper, and cannot be attracted by a magnet if the wire 2 is made of such a material alone. Therefore, a magnetic substance such as iron must be mixed as an impurity so that the wire 2 can be attracted by magnetic force.

Figure 3B:
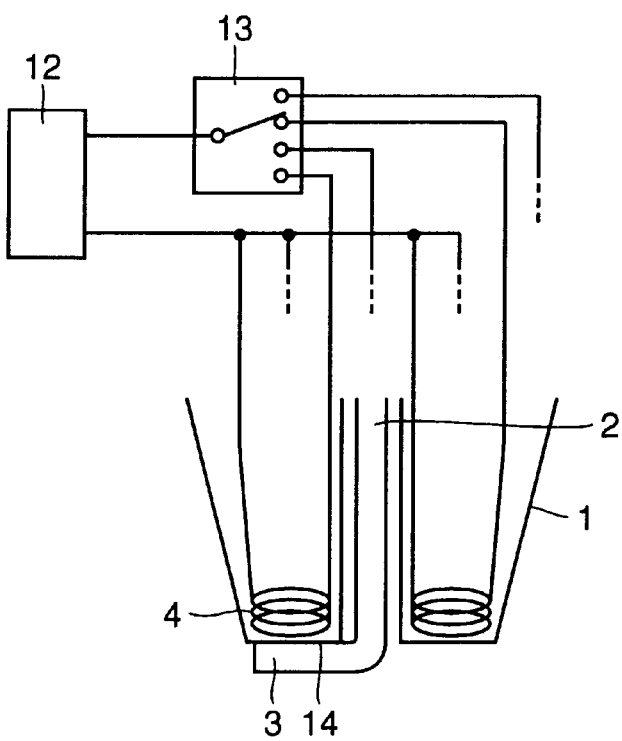
FIG. 3B is a schematic view of the bonding tool as seen from its lateral side.

When any one of the electromagnets 4 is operated by switching the switch 13, the wire tip end part 3 is attracted by the magnetic force to be adsorbed onto the pressing surface 14, as shown in FIGS. 3A and 3B. The first bonding is carried out in this state. The subsequent bonding steps are the same as those already described with reference to FIGS. 15 to 18.

Unlike the ball bonding method, balls need not be formed in the wire bonding method using the wire bonding apparatus according to this embodiment. Therefore, the wire can be joined with a small width, which is advantageous for the finer pitch. Also, since the recrystallized region is absent, it is advantageous for the lower loop.

In the wire bonding apparatus according to this embodiment, the wire tip end part 3 can be bent in a desired direction simply by switching the attracting and holding means selecting means, thereby eliminating the need for rotation of the wire bonding apparatus or the work piece as compared with the wedge bonding method.

Figure 4A:
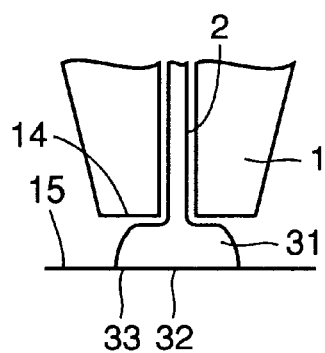
FIG. 4A shows a manner of press-bonding by the ball bonding method.
Figure 4B:
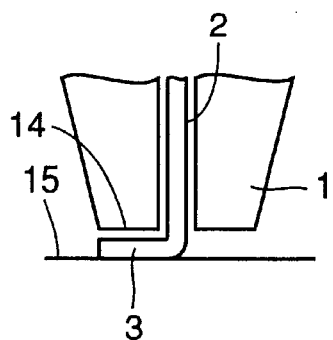
FIG. 4B shows a manner of press-bonding according to the first embodiment of the present invention.

Further, in the ball bonding method, the wire tip end part is pressed together with the ball 31 onto the pressing surface 14 by the pressing surface 14, as shown in FIG. 4A. Therefore, a load or a supersonic wave actually applied differs between a central part 32 and the peripheral part 33 of the ball 31. On the other hand, in the wire bonding method according to this embodiment, the whole of the wire tip end part 3 serving as a part to be joined in the wire 2 can be uniformly pressed by the pressing surface 14 as shown in FIG. 4B, so that the load or the supersonic wave can be uniformly applied, thereby improving the reliability of joining.

Here, in this example, four electromagnets 4 are used; however, a larger number of electromagnets can be used. If a larger number of electromagnets are used, the angle for attracting and bending the wire 2 can be designated at a finer interval.

(Second Embodiment)

A wire bonding apparatus according to the second embodiment of the present invention will be described. In the first embodiment, the electromagnets 4 are disposed in the inside of the bonding tool 1. However, in actual cases, the dimension of the bonding tool 1 may be too small and it may not be easy to dispose electromagnets 4 in the inside of the vicinity of its tip end.

Figure 5:
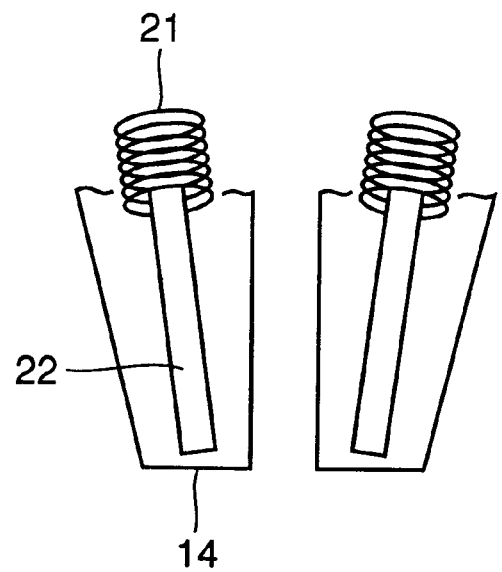
FIG. 5 is a schematic enlarged view of an essential part of one example of a wire bonding apparatus according to the second embodiment of the present invention.

For this reason, in this embodiment, a plurality of coils 21 for constructing the electromagnet are disposed at a position distant from the tip end of the bonding tool 1 and capable of ensuring a sufficient space, so as to surround the wire 2, as shown in FIG. 5. A core 22 of a magnetic substance serving as a magnetic path that transmits the magnetic line of force from the coils 21 to the tip end of the bonding tool 1 is extended so that the tip end of the core 22 reaches the inside of the tip end of the bonding tool 1. Here, in this wire bonding apparatus, the power source 12 and the switch 13 such as shown in FIG. 3B are not repeatedly illustrated; however, the apparatus includes them in the same manner as in the first embodiment. However, the switch 13 in this case is for selecting which of the coils 21 the electric current is to be passed through.

Figure 6:
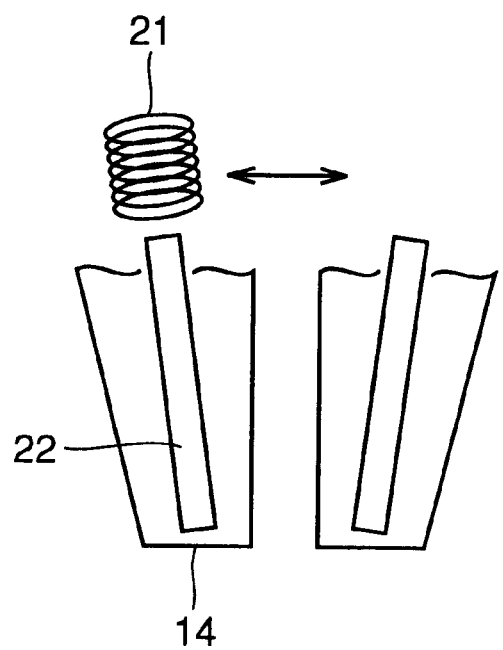
FIG. 6 is a schematic enlarged view of an essential part of another example of a wire bonding apparatus according to the second embodiment of the present invention.

Further, besides the construction shown in FIG. 5, for the plurality of cores 22, a smaller number of coils 21, for example, one coil 21, may be disposed as compared with the number of the cores 22, and the direction of generating the attraction force can be selected by moving the coil 21 itself, as shown in FIG. 6.

Other constituent elements not particularly mentioned are the same as in the wire bonding apparatus of the first embodiment.

Even if it is difficult to dispose a coil in the inside of the tip end of the bonding tool 1, the magnetic force can be generated with certainty at the pressing surface by adopting this construction, and the wire 2 can be attracted and held. In the example shown in FIG. 5 in this embodiment, if the switch 13 serving as an attracting and holding means selecting means selects which of the coils 21 the electric current is to be passed through, the direction of attracting the wire can be selected. Also, in the example shown in FIG. 6, the direction of attracting the wire can be selected by selecting a core 22 to which the coil 21 is to be approximated.

Therefore, the wire can be attracted and held in any one direction for first bonding. The subsequent bonding steps are the same as those already described with reference to FIGS. 15 to 18.

(Third Embodiment)

Figure 7A:
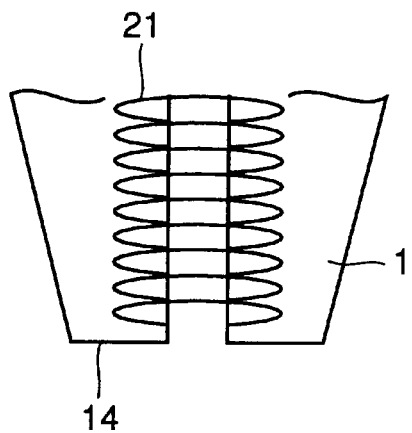
FIGS. 7A and 7B are schematic enlarged views of an essential part of a wire bonding apparatus according to the third embodiment of the present invention.
Figure 7B:
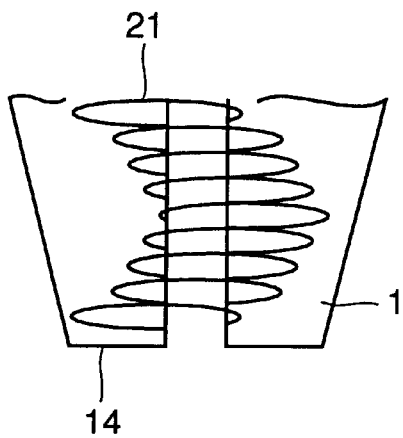

With reference to FIGS. 7A and 7B, the wire bonding apparatus according to the third embodiment of the present invention will be described. The construction thereof is basically the same as the one shown in the first embodiment; however, a coil 21 is disposed to surround the wire 2, as shown in FIG. 7A, instead of the plurality of electromagnets 4 (See FIGS. 3A and 3B). The coil 21 can be bent as shown in FIG. 7B.

The coil 21 is bent by a known technique. For example, in the example shown in FIG. 7B, members for supporting the coil 21 are disposed at upper, middle, and lower positions of the coil 21 as an attraction force distribution changing means so that the members can be displaced in a radial direction. By displacing the upper and lower members to the left side in FIG. 7B and displacing the middle member to the right side in FIG. 7B, the wire can be bent as shown in FIG. 7B.

By bending the coil 21, the distribution of the magnetic line of force generated from the lower end of the coil 21 in FIG. 7B will be nonuniform depending on the direction, so that the attraction force in a specific direction will be strong, and the wire 2 will be attracted in that direction.

Thus, the wire can be attracted and held in any one direction for first bonding. The subsequent bonding steps are the same as those already described with reference to FIGS. 15 to 18.

(Fourth Embodiment)

In each of the aforesaid embodiments, a magnet, particularly an electromagnet, is used as the attracting and holding means; however, a permanent magnet can achieve the same object besides the electromagnets. Further, suction using a negative pressure can be used instead of a magnet. In the fourth embodiment according to the present invention, an example is shown in which suction holes 5 are used as the attracting and holding means.

Figure 8A:
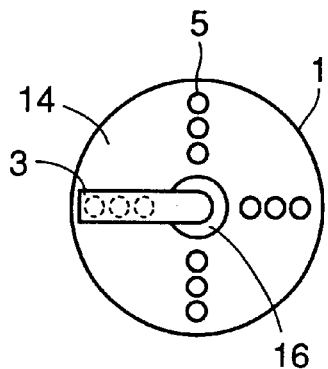
FIG. 8A is a schematic view illustrating an essential part of a bonding tool of a wire bonding apparatus according to the fourth embodiment of the present invention, as seen from its bottom side.
Figure 8B:
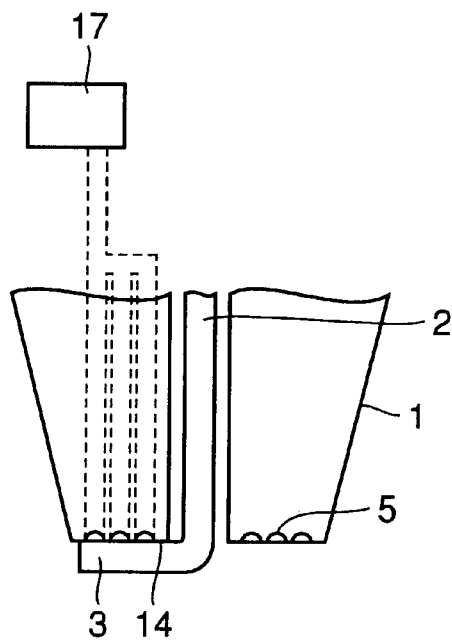
FIG. 8B is a schematic view of the bonding tool as seen from its lateral side.

FIGS. 8A and 8B show an essential part of a wire bonding apparatus according to this embodiment. As shown in FIG. 8A, a plurality of suction holes 5 are radially disposed in the pressing surface 14 of the bonding tool 1 as the attracting and holding means. Each of the suction holes 5 is in communication with a pipe part that passes through the inside of the bonding tool 1, as shown in FIG. 8B, and is connected to a negative pressure generating device 17. However, the suction holes 5 are classified in accordance with the directions as viewed from the wire feeding hole 16. In the example shown in FIG. 8A, one group of suction holes can be regarded as corresponding to one radial streak. This wire bonding apparatus has a structure such that a group directed to any one direction is selected to switch the connection of the pipe part, and the negative pressure is generated from the suction holes 5. Therefore, if negative pressure is generated from the suction holes 5 of one group, negative pressure is not generated from the other suction holes 5. Alternatively, if negative pressure is generated from the suction holes 5 of one group, positive pressure is preferably generated from the suction holes 5 of all the other groups or from the suction holes 5 of the opposite group with respect to the wire feeding hole 16.

If negative pressure is generated by a negative pressure generating device, the suction holes 5 attract the wire tip end part 3 together with the surrounding air, whereby the wire tip end part 3 is sucked onto the pressing surface 14, as shown in FIGS. 8A and 8B. If negative pressure is generated from the suction holes 5 of one group to attract the wire tip end part 3 while positive pressure is generated from the suction holes 5 of all the other groups or from the suction holes 5 of the opposite group with respect to the wire feeding hole 16, the wire tip end part 3 can be advantageously attracted with more certainty towards the suction hole 5 to which the wire tip end part 3 should be attracted. Also, the suction holes 5 have been described to be classified into groups here; however, one group need not be made of a plurality of suction holes 5. Therefore, a construction may be adopted in which each of the suction holes 5 is disposed on a different side, and each of the suction holes 5 is switched to perform suction, whereby the wire tip end part 3 is attracted to each side.

Such a case in which the wire 2 is attracted by utilizing a negative pressure is preferable because, unlike the case of using magnetic force, an impurity of magnetic substance need not be mixed into the material of the wire.

(Fifth Embodiment)

Figure 9A:
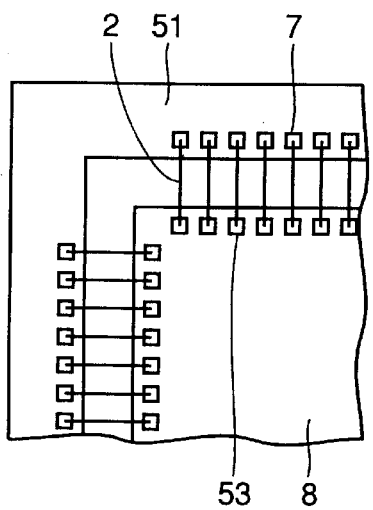
FIG. 9A is a plan view of a part of a semiconductor device according to a prior art.
Figure 9B:
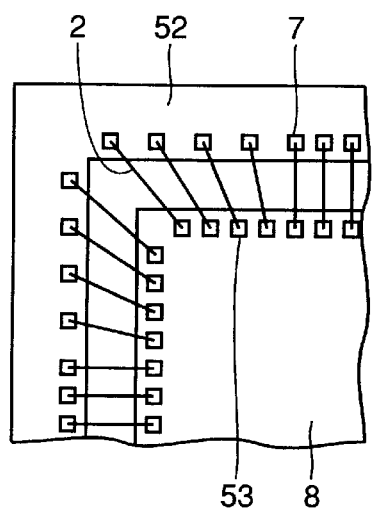
FIG. 9B is a plan view of a part of a semiconductor device according to the fifth embodiment of the present invention.
Figure 10A:
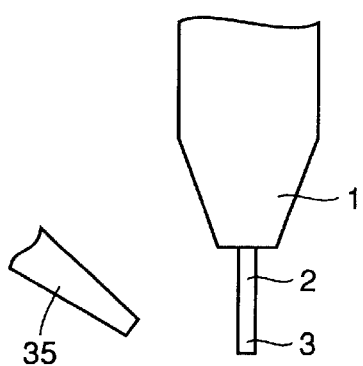
FIG. 10A and 10B are views for describing a wire bonding method according to a prior art.
Figure 10B:
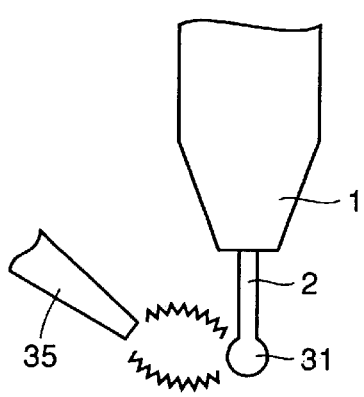
Figure 11:
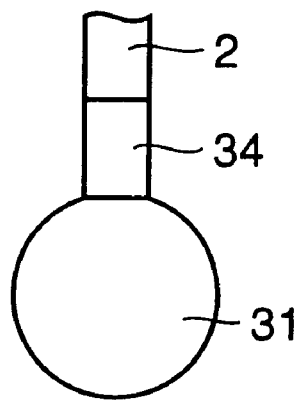
FIG. 11 is a view for describing a wire tip end part in the wire bonding method according to the prior art.
Figure 12:
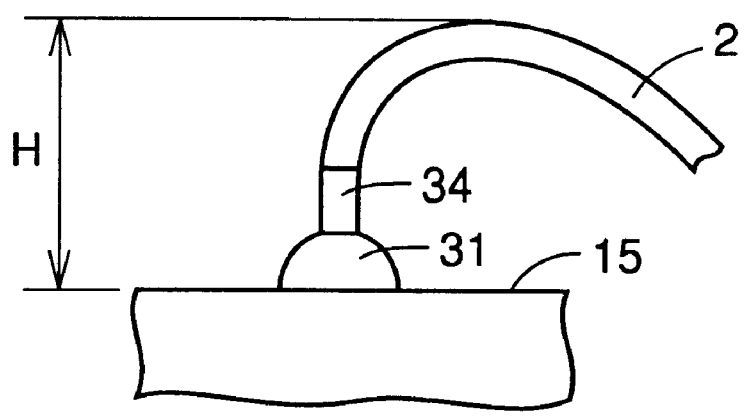
FIG. 12 is a view for describing a shape of a wire bonded by the wire bonding method according to the prior art.
Figure 13:
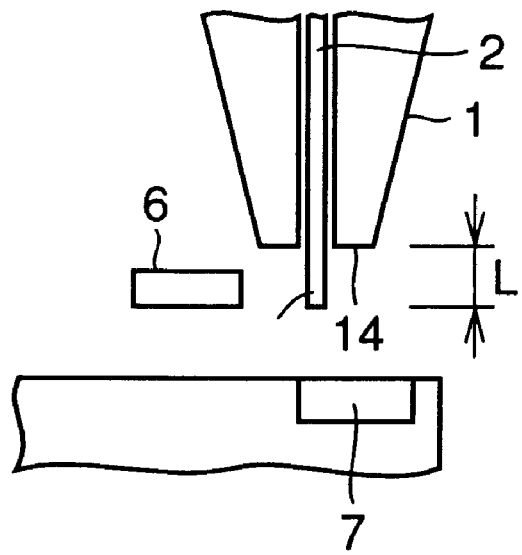
FIG. 13 is a view for describing the first step in a wedge bonding method, which is one of the wire bonding methods according to a prior art.
Figure 14:
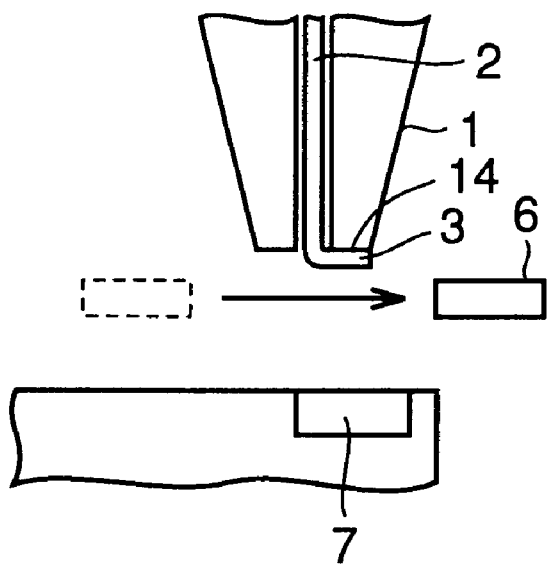
FIG. 14 is a view for describing the second step in the wedge bonding method, which is one of the wire bonding methods according to the prior art.
Figure 15:
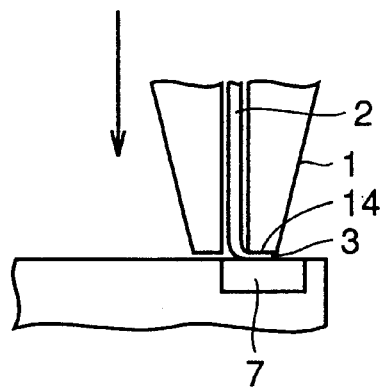
FIG. 15 is a view for describing the third step in the wedge bonding method, which is one of the wire bonding methods according to the prior art.
Figure 16:
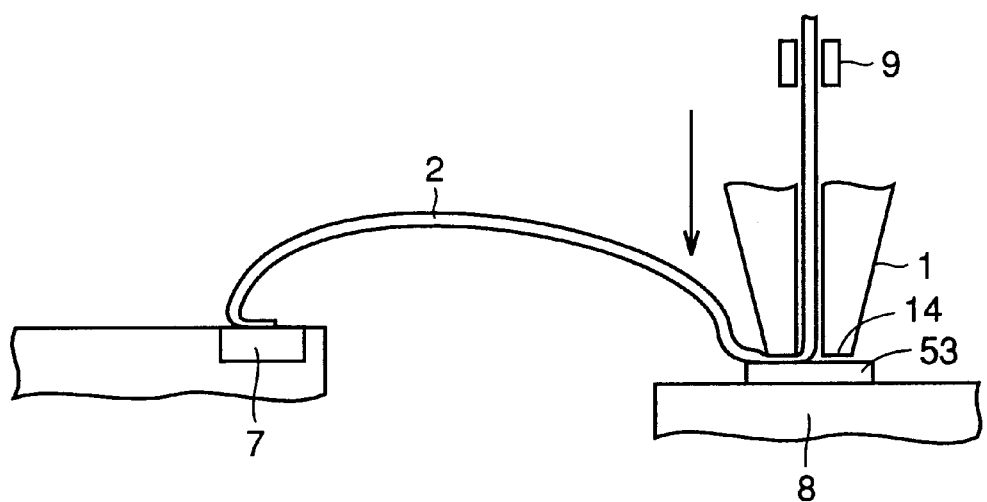
FIG. 16 is a view for describing the fourth step in the wedge bonding method, which is one of the wire bonding methods according to the prior art.
Figure 17:
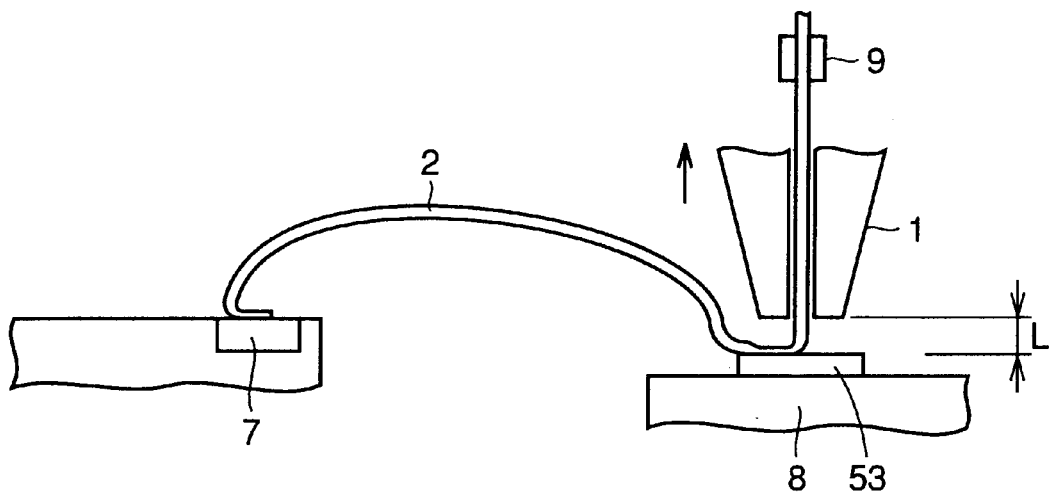
FIG. 17 is a view for describing the fifth step in the wedge bonding method, which is one of the wire bonding methods according to the prior art.
Figure 18:
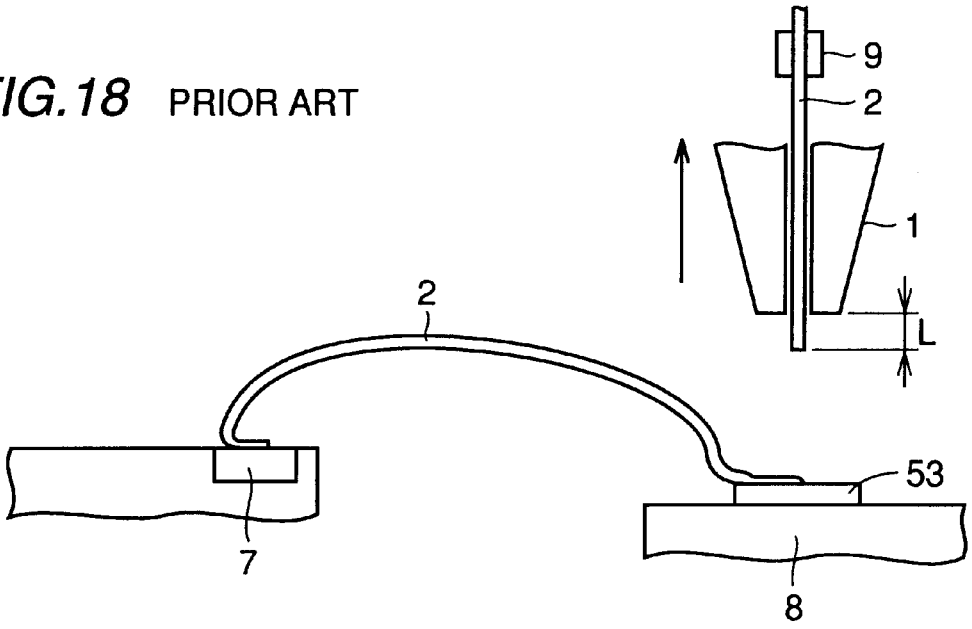
FIG. 18 is a view for describing the sixth step in the wedge bonding method, which is one of the wire bonding methods according to the prior art.

A semiconductor device according to the fifth embodiment of the present invention is a semiconductor device subjected to wire bonding by means of the wire bonding apparatus or the wire bonding method according to any one of the aforesaid embodiments. FIG. 9A shows an enlarged view of a part of a semiconductor device 51 of the same type according to a prior art, and FIG. 9B shows an enlarged view of a part of a semiconductor device 52 according to this embodiment.

In the prior art, if wire bonding is carried out by the wedge bonding method, the work piece must be rotated to extend the wire in a different direction. Therefore, the wire can be extended only in limited directions such as four directions shown in FIG. 9A, for example, For this reason, even at corner parts, the external leading electrodes 7 must be disposed at positions displaced in limited directions from the connection electrodes 53 on the semiconductor chip 8 side, so that the space in the corner parts cannot be sufficiently and effectively utilized.

On the other hand, if the present invention is used, the attracting direction can be finely adjusted by disposing a lot of attracting and holding means around the wire feeding hole and allowing the ON/OFF of attraction to be controllable. As a result of this, the direction of bending the wire tip end part can be finely set. Therefore, the direction of extending the wire can be flexibly changed at the corner parts, as shown in FIG. 9B, and the external leading electrodes 7 can be disposed with enough room by effectively utilizing the space in the corner parts.

According to the present invention, the wire tip end part can be attracted each time in a desired direction and held along the pressing surface by the attracting and holding means, so that the wire can be joined by pressing the wire to the surface to be joined by the bonding tool and treating it in the same manner as in the wedge bonding method. Therefore, the wire can be extended in a desired direction by adjusting the direction of attracting the wire tip end part. Furthermore, since the wire tip end part is bent by the attraction force without accompaniment of the movement of external members such as in the wedge bonding method, the reaction is fast, and the timing of the bending can be easily controlled.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wire bonding apparatus comprising:

a bonding tool having a pressing surface for pressing a wire onto a surface to be joined to the wire and a wire feeding hole having an opening in said pressing surface;

wire feeding means for feeding the wire outside of said bonding tool through the wire feeding hole; and attracting and holding means for applying an attraction force to a wire tip end protruding from wire feeding hole, for bending and holding the wire tip end directed towards said pressing surface.

2. The wire bonding apparatus according to claim 1, further comprising attraction force distribution changing means for changing a distribution of the attraction force of said attracting and holding means for bending the wire tip end in a desired direction.

3. The wire bonding apparatus according to claim 1, wherein said attracting and holding means includes a magnet disposed to apply a magnetic attraction force from said pressing surface to the wire tip end.

4. The wire bonding apparatus according to claim 3, wherein said magnet is an electromagnet.

5. A wire bonding apparatus comprising:

a bonding tool having a pressing surface for pressing a wire onto a surface to be joined to the wire and a wire feeding hole open to said pressing surface;

wire feeding means for feeding the wire outside of said bonding tool through the wire feeding hole;

a plurality of attracting and holding means for applying an attraction force to a wire tip end part protruding from the wire feeding hole for bending and holding the wire tip end directed towards said pressing surface; and attracting and holding means selecting means for bending the wire tip end in a desired direction depending on which of said plurality of attracting and holding means is operated.

6. The wire bonding apparatus according to claim 5, wherein said attracting and holding means includes a plurality of suction holes surrounding the wire feeding hole and for generating a negative pressure.

7. The wire bonding apparatus according to claim 6, wherein said suction holes are disposed in said pressing surface.

8. A wire bonding method using a bonding tool having a pressing surface for pressing a wire onto a surface to be joined to the wire and a wire feeding hole having an opening in the pressing surface, said method comprising:

feeding the wire through the wire feeding hole in said pressing surface;

applying an attraction force to a wire tip end protruding from the wire feeding hole, bending and holding the wire tip end towards said pressing surface; and pressing and joining the wire tip end onto a surface to be joined to the wire, with said pressing surface.

9. The wire bonding method according to claim 8, wherein the wire tip end is bent in a desired direction by changing a distribution of the attraction force.

10. The wire bonding method according to claim 8, wherein the wire tip end part is bent in a desired direction by switching which of a plurality of attracting and holding means is operated.

11. The wire bonding method according to claim 8, including applying a magnetic attraction force to the wire tip end.

12. The wire bonding method according to claim 11, including generating the magnetic attraction force with an electromagnet.

13. The wire bonding method according to claim 8, including applying a negative pressure to the wire tip end.

* * * * *